United States Patent [19]
Gibson

[11] Patent Number: 5,508,607
[45] Date of Patent: Apr. 16, 1996

[54] ELECTRONIC TEST INSTRUMENT FOR COMPONENT TEST

[75] Inventor: Greg S. Gibson, Lynnwood, Wash.

[73] Assignee: Fluke Corporation, Everett, Wash.

[21] Appl. No.: 289,752

[22] Filed: Aug. 11, 1994

[51] Int. Cl.⁶ .......................... G01R 13/00; G01R 13/20
[52] U.S. Cl. .................... 324/121 R; 324/111; 364/487
[58] Field of Search .......................... 324/76.77, 121 R, 324/76.52, 111; 364/483, 487

[56] References Cited

U.S. PATENT DOCUMENTS

| | | | |
|---|---|---|---|
| 3,299,352 | 1/1967 | Carroll | 324/121 R |
| 4,074,195 | 2/1978 | Hunt | 324/158 |
| 4,386,317 | 5/1983 | Clinton | 324/158 |
| 4,763,066 | 8/1988 | Young et al. | 324/73 |
| 4,965,516 | 10/1990 | Parshotam et al. | 324/158 |
| 5,003,254 | 3/1991 | Hunt et al. | 324/158 |
| 5,153,501 | 10/1992 | Shimada et al. | 324/121 R |

*Primary Examiner*—Ernest F. Karlsen
*Assistant Examiner*—Russell M. Kobert
*Attorney, Agent, or Firm*—Marger Johnson McCollom & Stolowitz

[57] ABSTRACT

A "component test" function is provided in a low-power, portable test instrument like a digital multimeter. A test stimulus waveform is synthesized digitally, and a digital trigger signal from the synthesizing circuitry is used to trigger acquisition of measurement data. A single-channel front end acquires voltage scan data over one cycle of the test stimulus waveform following the trigger point. Current scan data is later acquired through the same acquisition circuitry beginning at the same trigger point relative to the start of a later cycle of the stimulus waveform, so that the voltage and current scan data, although acquired separately, are very closely synchronized relative to the stimulus waveform, as a result of which they maintain their phase relationship. Stored voltage and current scan data are aligned accordingly and concurrently displayed so as to form a Lissajous pattern on a small display. The invention thus provides improved component test capability in a small, portable instrument, including graphic display of test results.

20 Claims, 4 Drawing Sheets

5,508,607

ELECTRONIC TEST INSTRUMENT FOR COMPONENT TEST

BACKGROUND OF THE INVENTION

The present invention relates to testing electronic components such as discrete, analog components, and more specifically, is directed to methods and apparatus for acquiring and graphically displaying component test data.

Passive components such as resistors and capacitors as well as semiconductor junctions can be tested by applying an appropriate stimulus signal to a device under test (DUT), and then measuring circuit parameters such as voltage and/or current. One problem in the prior art test equipment is the limited range of capacitance values that can be measured. Because prior art devices, such as the Huntron instrument described below, use analog oscillators as a source of test stimulus signals, their stimulus frequency range is limited. Accordingly, high capacitance components cannot be tested without a high-voltage stimulus source which in many applications is not practical. Moreover, stimulus signals generated using analog oscillators have only a limited selection of discrete frequencies available.

Graphical display of component test data, such as Lissajous patterns, is particularly useful in many applications. In the prior art, however, complex and expensive equipment such as an oscilloscope is required to generate such patterns. For example, using an oscilloscope, an X-channel can be used to acquire voltage data while a Y-channel is used to acquire current data. By displaying X versus Y with a common trigger to synchronize the display, Lissajous patterns or the like may be generated. This is not possible in simpler, hand-held instruments such as a digital multimeter (DMM) which have only a single channel "front-end".

A semiconductor test instrument known commercially as the "Huntron Tracker" is described in U.S. Pat. No. 4,074, 195. It is used for determining operating states of a semiconductor junction, and displaying a trace representative of the characteristics of the junction. One of the problems with the Huntron type of apparatus is that it requires a multi-tap transformer and voltage dividers for providing a range of AC test stimulus signals. More specifically, the prior art teaches a transformer driving a set of vertical voltage dividers to provide test signals for vertical deflection of the display, together with a set of horizontal voltage dividers to provide test signals for horizontal deflection of the display. See FIG. 1 of the '195 patent and column 4. The '195 system therefore requires constant AC power for operation, a heavy transformer, and a two-channel (vertical and horizontal) high-voltage display system like an oscilloscope. That technology, therefore, is not useful in lightweight, portable test equipment which is desirable for field use, for example by a repair technician.

The need remains, therefore, to provide new methods and apparatus for component testing which do not require high power or bulky equipment, yet provides wide range and high accuracy, at minimum cost.

SUMMARY OF THE INVENTION

One object of the present invention is to provide a variable frequency, highly accurate source of test stimulus signals to allow a larger range of capacitance testing without the complications of high-voltage circuitry.

A further object of the invention is to provide graphical current vs. voltage displays for rapid in-circuit testing of passive components and p-n junctions using a small, portable test instrument.

Another object of the invention is to allow a user to select a desired frequency of a test stimulus signal.

A new paradigm for component test is described herein to provide improved accuracy, greater flexibility and at the same time obviate entirely the need for heavy transformers and high-voltage display systems. Moreover, the present invention includes a component test system that may be implemented in a portable digital multimeter type of test instrument to provide a new graphical display. The new methods and apparatus are compatible with the simple multimeter type of user interface - based on a large rotary function switch –that is familiar to many field technicians, repair persons and engineers. Accordingly, user training requirements are minimal.

Another aspect of the invention is to employ digital synthesis of test stimulus waveforms. This has the advantages of high accuracy and low power requirements, so that the invention can be embodied in a compact, portable, battery-operable test instrument, as disclosed herein. Digital synthesis allows a wide range of frequency of AC test stimulus signals, so that a wide range of components such as capacitors can be tested without high voltages.

A further aspect of the invention is to acquire both voltage and current test scan data using only a single channel "front-end". Prior art requires independent vertical and horizontal input channels, amplifiers, deflection circuits, etc. The two channels are synchronized by a common trigger, and operate in parallel, i.e., simultaneously, in the prior art to generate Lissajous displays. According to the present invention, most of this redundancy is eliminated by using only one "front end" channel. Vertical and horizontal scans, e.g., voltage and current scans, actually are performed one at a time. However, precise digital triggering is used to synchronize the acquired data, so produce Lissajous display patterns as though two channels were in use. More specifically, a test periodic stimulus waveform is synthesized digitally, and a trigger signal is provided by the synthesis circuitry to indicate, very accurately, a predetermined trigger point relative to the start of each cycle of the stimulus waveform. This trigger signal is used to start acquisition of voltage scan data. After the first scan is completed (and the data stored), the same trigger signal is used to retrigger acquisition of current scan data. The current scan therefore begins at the same trigger point relative to the start of a later cycle of the stimulus waveform. The acquired data is stored in digital form, and simultaneously displayed in orthogonal directions to form a Lissajous pattern.

Another aspect of the invention is a digital multimeter (DMM) that includes means for providing a graphic display of test data. In particular, the improved DMM includes a component test mode of operation in which it displays Lissajoustype patterns for fast component identification and screening without use of complicated equipment such as oscilloscopes and elaborate testing procedures. An electronics technician or repair person can quickly use the improved DMM in component test mode without special training or test setup. Component test mode can be selected using a rotary function switch in the same manner as conventional voltage or impedance measurements are taken. The resulting display patterns provide quick visual feedback for component identification or simple good/bad decisions for troubleshooting.

A further aspect of the invention is to provide methods and apparatus for testing high impedance reactive circuits or circuit elements by increasing the frequency of an AC test stimulus signal. This has the advantage of allowing use of low-voltage test signals without sacrificing range and accuracy. The test stimulus signal is digitally synthesized in the preferred embodiment, and its frequency thus can by selected by applying an appropriate frequency clock signal to the synthesizer circuitry. For example, in one embodiment described below, a test instrument according to the present invention can measure capacitance over several decades of range, e.g., from 7200 pF to 72 NF. Since the frequency of the stimulus waveform is varied, rather than its voltage, the instrument can be operating on a battery power supply for portability. The stimulus waveform has a fixed amplitude on the order of a few volts.

The present invention combines the foregoing aspects to provide a component test function that includes graphical output in a lightweight, portable test instrument otherwise similar to a DMM.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

I. SYSTEM OVERVIEW

Figure 1A:
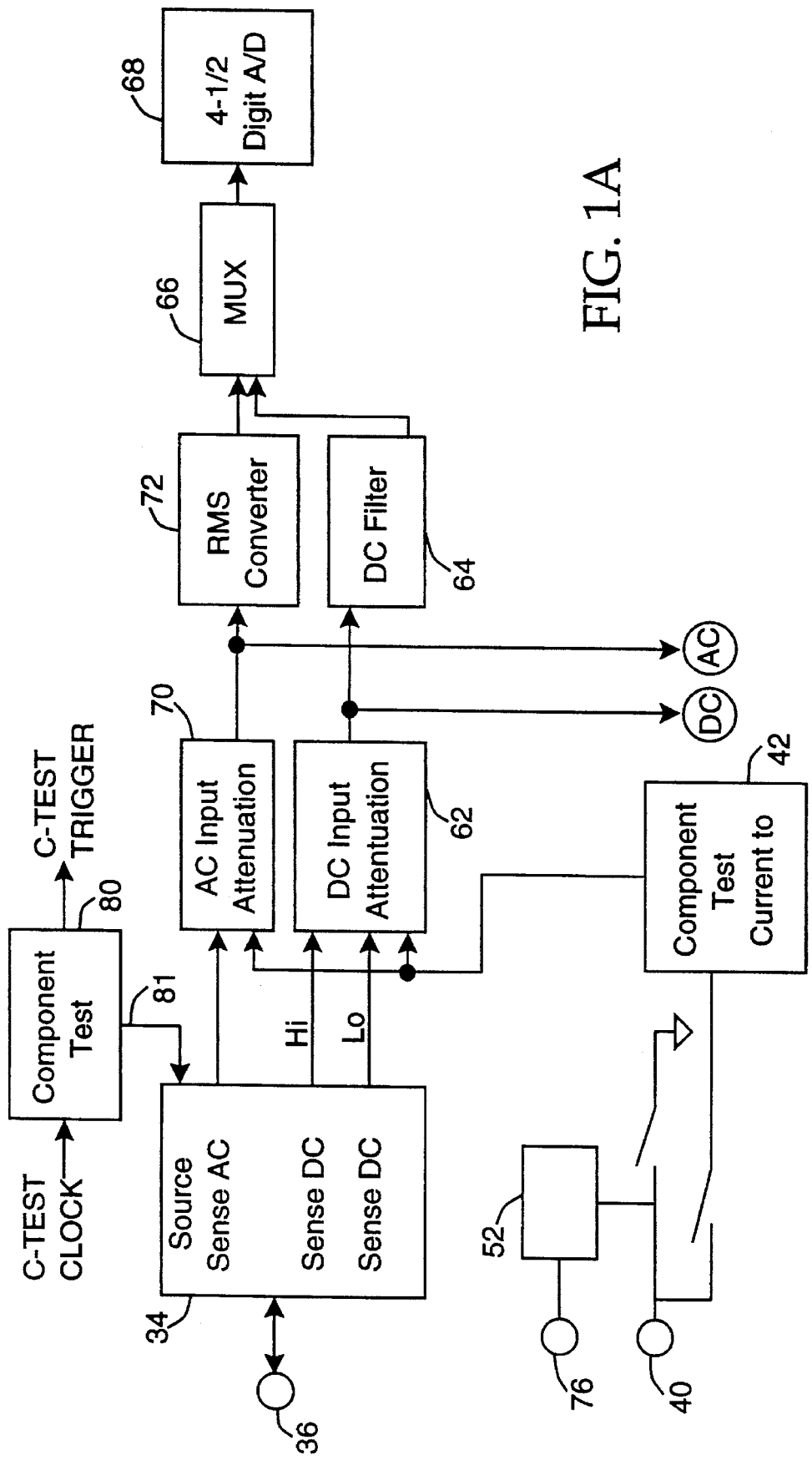
FIGS. 1A and 1B form a simplified block diagram of a test instrument that embodies various aspects of the present invention in the currently preferred embodiment.
Figure 1B:
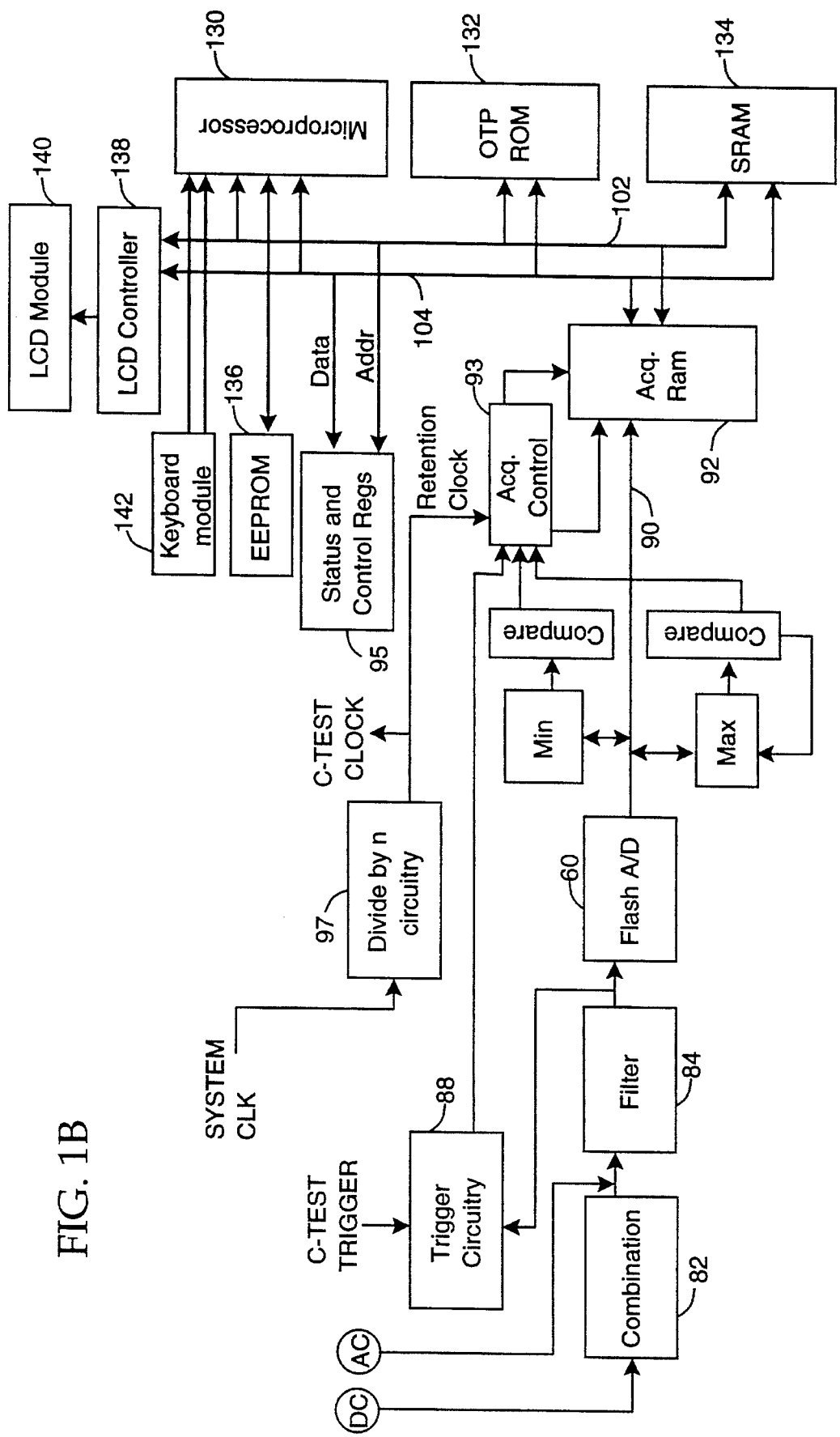

FIGS. 1A–1B together form a general block diagram of a test instrument that embodies aspects of the present invention. The test instrument is similar in several of its functions to a known digital multimeter. For example, the instrument can be used to measure voltage, current or impedance as explained below. Additionally, it incorporates new features, circuits and methods of operation, as explained below, directed specifically to component testing. Since the component test aspects are interrelated with the overall system apparatus and operation, the instrument is described generally at the outset. The instrument generally comprises a front end, a data acquisition section, a control/memory section and a display section, each of which is described in turn as follows.

Front End Section

Referring to FIG. 1A, the "front end" section of the test instrument includes a pair of terminals 36, 40 for coupling a device under test (DUT) to the instrument via appropriate test leads or probes (not shown), as is conventional. For example, to measure AC or DC voltage, one lead is connected to a selected circuit node or DUT and a second lead is connected between terminal 40 and circuit ground or the opposite side of the DUT. For DC voltage measurement, the input voltage presented at terminal 36 passes through a protection circuitry 34 (via either high voltage or low voltage path) to a DC input attenuation circuit 62. When the instrument is set to operate as a DC voltage meter, the attenuated DC input signal passes through a DC filter 64 and a multiplexer 66 to an analog-to-digital converter A/D 68 for conversion into digital form. Display of the results is discussed later.

For AC measurements, the input signal originating at terminal 36 is routed through protection circuit 34 to an AC input attenuation circuit 70. The output of attenuation circuit 70 is coupled through an RMS converter 72 into the multiplexer 66. During AC meter operations, multiplexer 66 couples the RMS AC signal to the A/D converter 68. For current measurements, one or more additional terminals, e.g., terminal 76 (rather than the common terminal 40), is used for connecting the second lead to current switching circuitry 52. Further description of input attenuation and of meter operations is omitted as such is unnecessary to understanding the present invention. The front end also includes a component test source circuit 80 for providing test stimulus waveforms as described in detail later.

Data Acquisition Section

The Data Acquisition Section is described next with emphasis on aspects pertinent to component testing. When the test instrument is switched to the component testing function, a component test source circuitry 80 is activated to provide a periodic test stimulus signal. The stimulus signal is output through protection circuit 34 to a DUT 38 (FIG. 2) through terminal 36. During a voltage scan (further described below), terminal 36 is coupled through the protection circuit 34 to the DC input attenuation circuit 62 for measuring voltage at the terminal. The output of attenuation circuit 62, labeled "DC", is coupled to a combination circuit 82 (see FIG. 1B). From the combination circuit 82, the DC signal is input to a filter circuit 84. AC input voltage or signals pass through the protection circuit 34 to the AC input attenuation circuit 70 (FIG. 1A), the output of which, labeled "AC", is coupled to the filter circuit 84 (FIG. 1B).

The combination circuit 82 and filter circuit 84 thus recombine the AC and DC voltage components of the terminal signal, and the combined signal is input to a flash A/D converter 60 for conversion to digital form. The flash A/D is driven by a relatively fast clock, further described below. The resulting digital values are transmitted over a data bus 90 for storage in an acquisition memory 92, also further described below.

Component testing also includes acquiring current measurement data as follows. During component test mode, common terminal 40 is coupled to a component test current-to-voltage conversion circuit 42. The resulting voltage (representing current) is coupled to both the DC input attenuation circuit 62 and the AC input attenuation circuit 70. In alternative embodiment, these voltages may be routed through the protection circuit 34 to the attenuation circuits. (it should be noted here that voltage and current measurements are not conducted simultaneously. Thus, portions of the front end are used for both functions.) The DC and the AC voltage signals then are combined, filtered and converted to digital form as described above in the case of component test voltage measurements. The resulting digital current data also is provided over data bus 90 for storage in the acquisition RAM 92. Acquisition RAM 92 is a random access memory having a total size, in the currently preferred embodiment, of 512 by 8 bits. Operation of the data acquisition section is described in greater detail below in part III.

Control and Memory Section

Referring to FIG. 1 B, a microprocessor 130 is coupled to an address bus 102 and a data bus 104. The acquisition RAM 92 also is coupled to the address and data buses. Under control of the microprocessor 130 and appropriate software, scan data temporarily stored in the acquisition RAM 92 is transferred over data bus 104 to a system memory SRAM 134. The address and data buses also are coupled to a status and control registers 95, EEPROM 136 and read-only memory (ROM) 132. The EEPROM and ROM are used for storing software further described below. The common address and data buses 102, 104 also are coupled to a LCD (liquid crystal display) controller 138 for displaying stored data on a LCD module 140 described next.

Display Section

Figure 4:
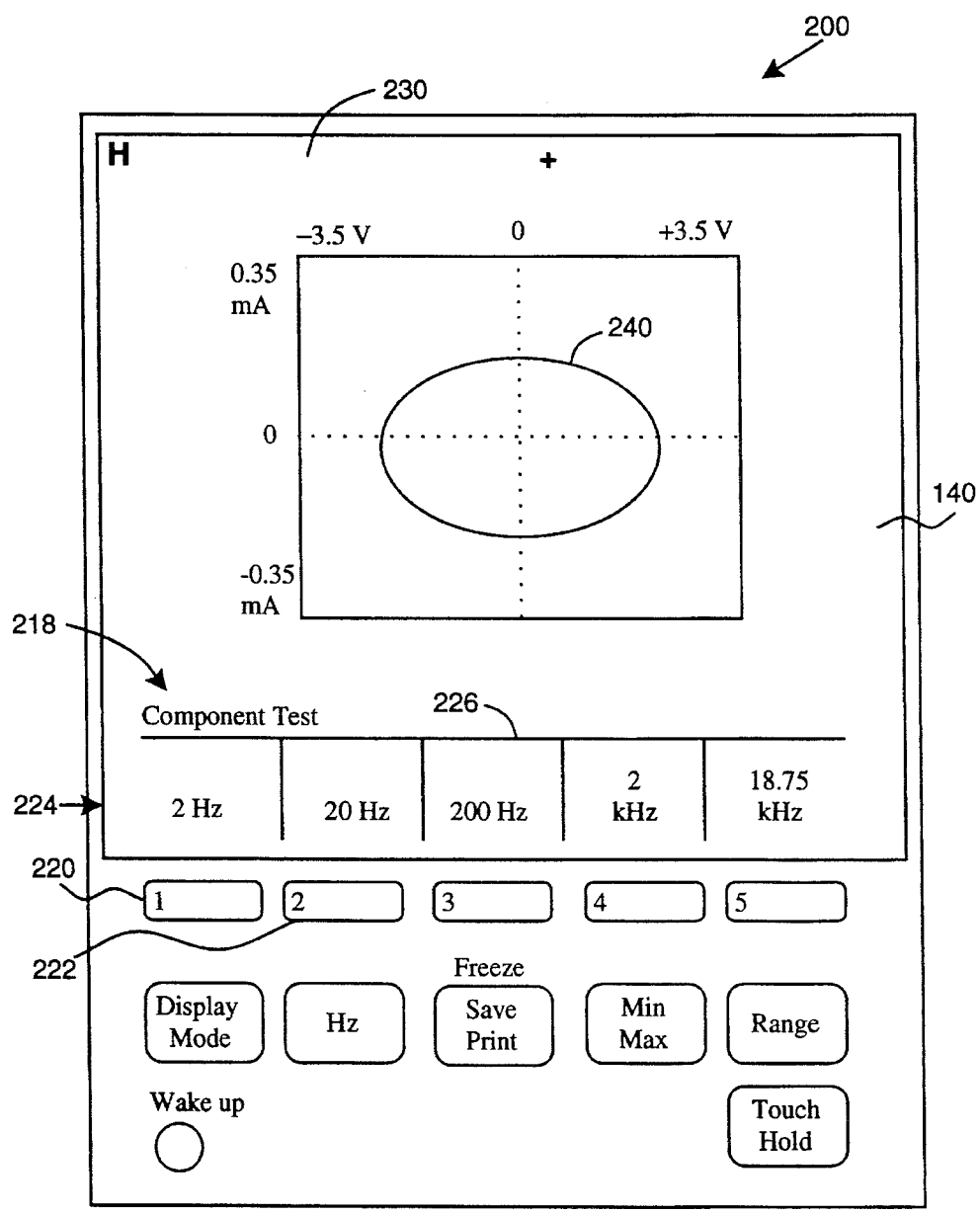
FIG. 4 illustrates a portion of the front panel of a test instrument, showing a graphic component test display generated according to the present invention.

In a preferred embodiment, a graphical display is provided by a liquid-crystal display device, a variety of which are commercially available. LCD have the advantages of ruggedness, low cost and low power requirements versus other display technologies. However, any pixel-addressable display means can be used. An LCD suitable for the present application may be transflective or reflective and optionally may be backlit. In one commercial embodiment of the invention in a portable test instrument, an LCD module 140 has a total of 200 pixels (vertical) by 240 pixels (horizontal). Only 128 pixels vertically are used for a graphical display such as a Lissajous pattern (vertical corresponds to volts). Accordingly, only the 7 most significant bits (msb) of data are used. This leaves space for display of other text or numeric information such as meter operating mode, scaling, etc. above or below the graphical portion of the display. As for the horizontal display, 256 levels (8 bits) are stored and displayed. In practice, however, the 240 horizontal pixels are adequate as the data does not reach full scale. The display is centered over approximately 80 percent of full scale. Thus, the graphical portion of the display measures 128 high by 180 pixels wide. Referring to FIG. 4, front panel 200 has a liquid crystal display 140 of the type described. A graphical portion 230 of the display shows a Lissajous pattern 240 formed as described above. Other features of the display are described later.

II. DIRECT DIGITAL SYNTHESIS OF TEST STIMULUS WAVEFORMS

Hardware

Figure 2:
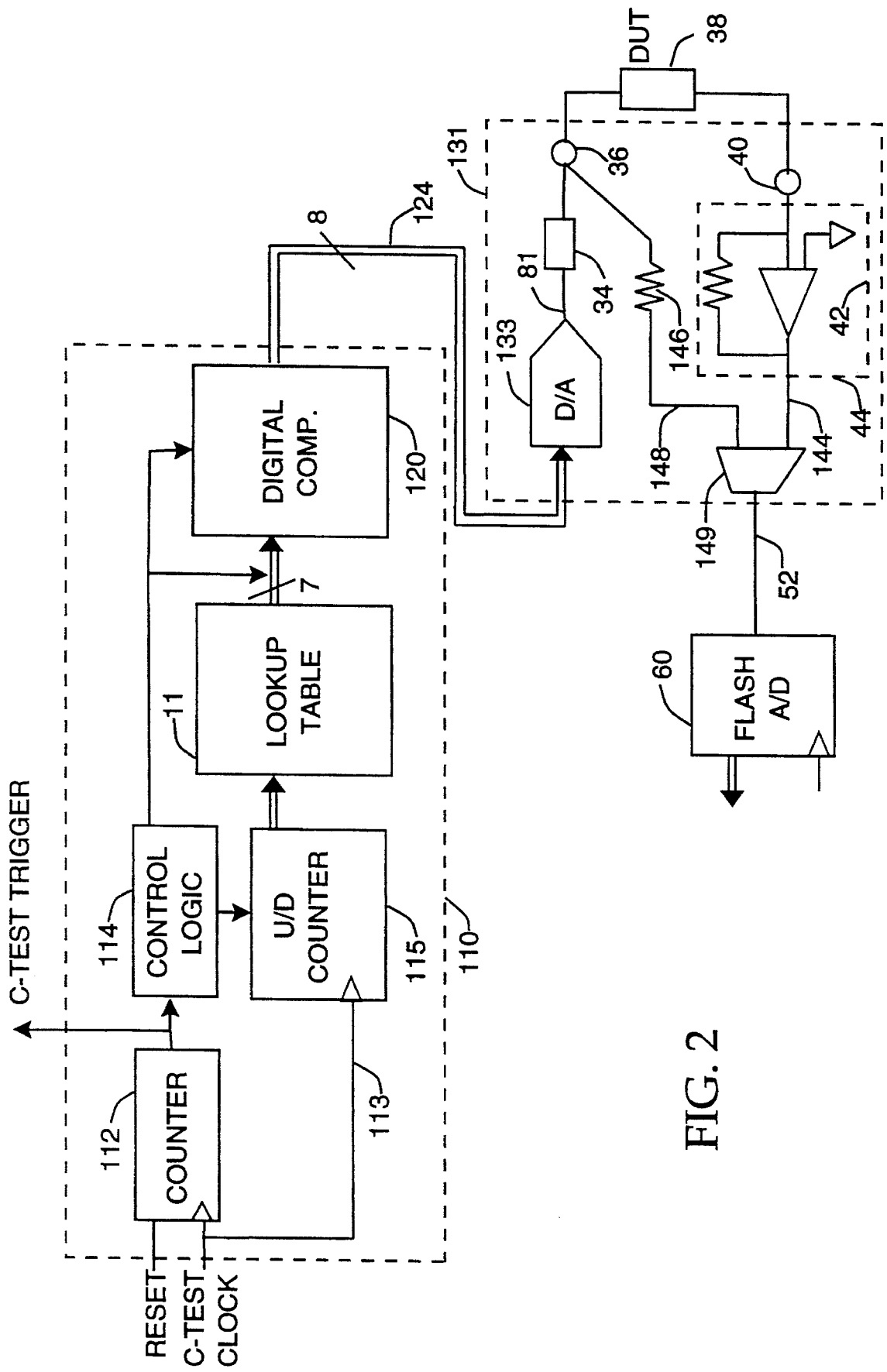
FIG. 2 is a partially schematic/partially block diagram showing the component test signal source 80 of the test instrument of FIG. 1A in greater detail.

FIG. 2 is a diagram of selected portions of the test instrument of FIGS. 1A–1B, to illustrate implementation of direct digital synthesis of test stimulus waveforms. FIG. 2 generally corresponds to the "component test source" 80 of FIG. 1A. Digital synthesis is a technique for generating variable frequency, repetitive signals, such as a sine-wave. The disclosed apparatus may be used, however, to generate other waveforms such as a staircase or an arbitrary waveform.

Referring now to FIG. 2, a digital synthesis module 110 provides a test stimulus signal in digital form, i.e., as a series of digital values, to a digital to analog converter D/A 133. D/A 133 converts these values to form a corresponding analog test signal, which in turn is output to a device under test DUT 38 through terminal 36 as described above. In module 110, a clock input signal, called C-TEST CLOCK, is applied to an 8-bit counter 112. Counter 112 controls the entire stimulus generator circuitry as further described below. The C-TEST CLOCK has a frequency equal to 256 times a user-selected test stimulus signal frequency. (The C-TEST CLOCK source is described later.) Counter 112 is coupled to a control logic block 114, which in turn controls a 6-bit up/down counter 115, by selecting UP or DOWN counting modes. The up/down counter 115 receives the component test clock input signals via clock signal line 113. Accordingly, counter 112 and up/down counter 115 count at the same rate, but since counter 112 has two more bits, it has four more states. These four states correspond to the quadrants of the synthesized test stimulus signal.

The up/down counter 115 supplies a six-bit address to a look-up table 118, which can be stored in a memory such as a ROM or EPROM or other non-volatile memory. In the preferred embodiment, the lookup function is provided by combinatorial logic rather than a true memory. This strategy is advantageous for implementation in an integrated circuit such as a digital ASIC as it requires fewer gates than a true ROM table. The address bits from up/down counter 115 are used to sequentially access 64 predetermined values in the look-up table. For example, if the desired test waveform is a sine wave, the 64 stored values form one quadrant of the sine wave, starting at a zero crossing. In the preferred embodiment, the look-up table provides 64 words of 7-bits each, each word containing the seven least significant bits of the quarter sine-wave data. An overflow output of counter 112 provides the component test ("C-TEST") trigger signal. This signal is asserted once per cycle of the test stimulus waveform as further explained below. The C-TEST TRIGGER signal provides an exact trigger point for both current and voltage scans.

Lookup table 118 provides the series of 7-bit values to a digital complementor circuit 120. The digital complementor circuitry 120 complements or buffers the lookup table 118 output, depending on its input from the control logic 114. The resulting values, together with the inverted most significant bit from counter 112, are provided as inputs to the 8-bit digital-to-analog converter DAC 133. Referring now to FIG. 2 as well as FIGS. 1A–1B, interface circuitry indicated by dashed line 131 includes a DAC 133, as well as elements common to FIGS. 1A–1B. Thus, the protection circuit 34 and the terminal 36 are shown for coupling the synthesized test stimulus signal to DUT 38. The DUT also is coupled to input terminal 40. Current through the DUT is converted to voltage in the component test current to voltage conversion circuit 42 to form a representative voltage at node 144 during a current scan. The stimulus signal at terminal 36 also is coupled through a resistor 146 to present the stimulus voltage at node 148. Nodes 144 and 148 are coupled to respective inputs of the input multiplexer 149 for selecting one of these signals at a time. The selected signal is output from multiplexer 149 to a flash ND converter 60.

Operation of Digital Test Signal Synthesis

Figure 3:
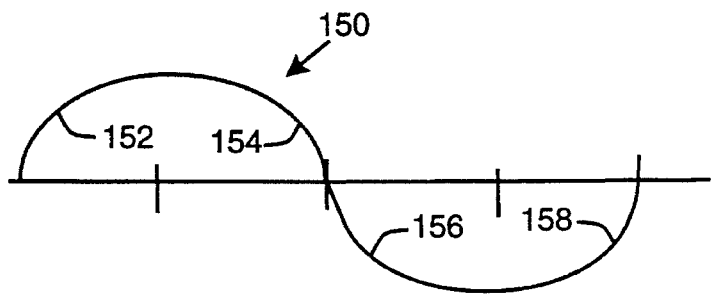
FIG. 3 illustrates a test stimulus signal generated by the instrument of FIGS. 1A–1B and FIG. 2 in a component test mode of operation.

Referring now to FIGS. 2 and 3, an example of a digitally synthesized test signal waveform 150 is illustrated. During the first quadrant 152, counter 112 and up/down counter 115 synchronously count UP, with the most significant bit of counter 112 being zero (msb=0). Up/down counter 115 outputs a series of 64 addresses to the lookup table 118, and the resulting series of digital values are passed to the DAC 133 as noted previously. This series of values, converted to analog voltage levels, forms the first quadrant of waveform 150. Control logic 114 receives the msb of counter 112, and responsive thereto sets the digital complementor 120 off i.e., the input signals to the complementor are passed to the output (D/A 133) without complementation. This is true during the first and second quadrants.

During the second quadrant 154, the sine-wave has the same values as the first quarter, but they occur in reverse order. To accomplish this, Up/down counter 115 is controlled by control logic 114 to count DOWN. Again, the lookup values are not complemented but are passed to the DAC 133, thereby forming the second quadrant of the stimulus signal 150.

To generate the second half of the sine-wave, several changes must occur. First, the most significant bit (msb) of counter 112 is set (msb=1). This bit, when inverted and passed to the most significant bit of DAC 133, causes the DAC to use the lower half of its scale. Second, this bit enables the digital complementor 120 to complement the digital values from the lookup table. The complemented data causes DAC 133 to achieve the concave shape of this second half of the waveform 150. The up/down counter 115 counts up during this third quadrant 156. To summarize, during this quadrant, up/down counter 155 is again counting UP, the digital complementor is enabled, and DAC 133 is using the lower half of its scale.

Finally, during the last quadrant 158, the Up/down counter is switched to again count DOWN and the complementor remains on, thereby completing the digitally synthesized sine-wave. After the fourth quadrant, counter 112 overflows and the process starts over automatically, thereby generating a consistent, periodic stimulus signal. The circuitry disclosed has the advantage of minimizing the necessary circuitry because digital values need be stored in the lookup table for only one-fourth of each cycle of the desired waveform. Other periodic waveforms can be generated in the manner described.

Stimulus Signal Voltage

The component test stimulus waveform is coupled to the DUT at terminal 36 through a source channel of the protection circuit 34. This channel includes an op-amp (not shown) coupled to the output of D/A converter 133 (FIG. 2) to provide the stimulus signal. In a presently preferred commercial embodiment, the stimulus waveform has a peak voltage of 3.2 volts. An internal power supply provides a fixed 5 volts DC to power the instrument. The instrument can be powered by AC line voltage through a "battery eliminator" as is known, or by batteries for portable operation. For example, a series of approximately 6–8 "AA" size batteries can be used to provide raw power to the internal DC supply. Alternatively, a NiCad battery pack can be used to allow for recharging the supply. A suitable NiCad battery pack, commercially available, provides approximately 6–12 volts DC, depending on the charge level. The 3.2 volt peak fixed stimulus voltage is adequate for testing a wide range of reactive components, e.g., capacitors having values in a range of approximately 7200 pF to 72 µF, by selecting the stimulus waveform frequency over a range of 2 Hz to 20 kHz, as described below. The frequency is selected so that the resulting graphic display (such as a Lissajous pattern) is of appropriate size for easy visual inspection. This range of frequencies is available using the above digital synthesis technique. Accordingly, an advantage of the present invention is the ability to test components over a wide range of reactance, and obtain useful graphic displays of scan data, using a fixed, low-voltage stimulus signal source.

III. COMPONENT TEST OPERATION

Continuous Data Acquisition

In operation, when the instrument is switched to the component test mode of operation, the component test stimulus waveform generator described above is activated (by the control microprocessor 130) so that it continuously generates a periodic stimulus waveform such as a sine wave. The stimulus waveform is applied to the DUT as described above. Other sources of test waveforms could be used. For example, an external signal generator could provide the stimulus signal, as long as a trigger signal synchronized with the external signal is also provided for triggering data acquisition as will become apparent.

Measurement data is acquired continuously through the hardware as described above. More specifically, the acquisition control circuit 93 controls acquisition RAM 92 so as to write a data point into the RAM on each cycle of the retention clock, which is provided to the control circuit by a divide-by-n circuit 97 (FIG. 1B). In the currently preferred embodiment, 256 data points are acquired over each cycle of the test stimulus waveform. Note that the C-test clock runs at 256 times the test waveform frequency. Accordingly, the retention clock and the C-test clock in this case are the same. Divide-by-n circuit 97 receives a system clock signal having a frequency of, for example, 19.2 MHz, as provided by a crystal-based oscillator (not shown). Data points are stored sequentially into the RAM 92, which is arranged as a circular buffer. Thus, new data overwrites previously stored data once the buffer is full.

The user can select a desired test stimulus signal frequency. A value of "n" corresponding to the selected frequency is stored in a register for controlling the divider circuit 97 to provide the appropriate clock signal as both C-clock and the retention clock. Referring again to FIG. 4, front panel 200 includes a pixel-addressable display module 140 such as the LCD display described above. A row of "soft keys", for example soft keys 220, 222 may be used for selection of a desired frequency. "Soft keys" refers to hardware keyswitches (labeled 1–5 in the figure) which are used for different input functions depending on the present mode of operation of the instrument. Note the mode indicator 218 on the display screen indicating that the instrument is in the "Component test" mode. In that mode, soft keys 1–5 correspond to stimulus signal frequencies of 2 Hz, 20 Hz, 200 Hz, 2 kHz and 18.75 kHz respectively, as indicated along the bottom of the display at 224. One of the soft keys labeled 226 is highlighted or reverse video to indicate the currently selected value of 200 Hz.

Scan Triggering

Next, the microprocessor sets a flag (in status and control registers 95) to indicate start of a voltage scan. In response, the acquisition control circuit 93 enables a storage trigger. At the beginning of the next cycle of the test waveform (e.g., when counter 112 next overflows after the storage trigger is enabled), a voltage scan begins. Thus, the voltage scan is triggered by the start of the next test waveform cycle. At that time, the current value of the acquisition RAM address is stored in a register, so that it points to the start of the stored voltage scan data. Measurement data continues to be acquired and digital voltage samples stored in the acquisition RAM for exactly one cycle of the test stimulus signal. This completes one scan –referred to as a voltage scan where voltage is being acquired. The acquired sample data comprises a series of 256 digital data words or values. Once 256 values have been acquired, storage in the RAM is stopped so that it is not overwritten. The microprocessor then moves the acquired scan data into SRAM 134.

After the voltage scan is completed, the front end circuitry is switched to acquire current data as described previously. The microprocessor then sets a flag to initiate the start of the current scan. Again, data acquisition continues, with acquired current sample data being stored in RAM 92 in the same fashion as voltage data. As in the case of a voltage scan, the acquisition control circuit 93 enables a storage trigger. At the beginning of the next cycle of the test waveform, i.e., when counter 112 next overflows after the storage trigger has been set, a current scan begins. The present value of the acquisition RAM address is stored as a start address for the digital current scan data. Acquired data is stored over one cycle, i.e., 256 data points as with the voltage sample data. Subsequently, the stored current scan data is moved into SRAM 134.

Note that both current and voltage scans were triggered by exactly the same trigger point, namely the beginning or other predetermined phase point of a test stimulus waveform cycle. As a result, the stored voltage and current scan data are "synchronized" with respect to the periodic stimulus waveform, and therefore their phase relationship is maintained, just as if they had been acquired simultaneously. Although the foregoing operation described the voltage scan as preceding the current scan, the order of the scans can be reversed.

The stored digital voltage and current scan data are aligned in the SRAM. That is, they are stored as voltage –current data pairs, in the order acquired, starting from a common starting address in the SRAM. In this way, the data pairs are conveniently provided to the LCD controller 138 for concurrent display so as to form a Lissajous pattern on the display module 140.

While it is convenient to trigger on the rising zero-crossing of the periodic test waveform, any arbitrary phase point on the cycle can be used as the trigger point. It is essential only that the same trigger point be used for both voltage and current scans if Lissajous patterns are desired for display. Overflow of counter 112 conveniently provides a trigger signal corresponding to the positive zero-crossing of the test waveform. Any state of the counter, however, corresponding to any desired point on the test waveform could be decoded to provide the trigger signal. Other parts of the waveform generation circuit can also be used to generate the trigger circuit, such as the up/down counter 115.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. In an electronic test instrument having a single-channel front-end comprised of a pair of terminals coupled to voltage and current measurement circuitry, a method of component testing comprising the steps of:

coupling a DUT across the pair of terminals of the test instrument for voltage and current measurements;

applying a repeating, periodic test stimulus waveform to the DUT through the pair of terminals;

measuring voltage across the DUT to acquire sampled voltage scan data over a first predetermined period of time;

measuring a current through the DUT to acquire sampled current scan data over a second predetermined period of time non-overlapping the first predetermined period of time; and triggering the commencement of each of the voltage and current measuring steps at respective selected trigger points relative to the periodic test stimulus waveform so that the sampled voltage and current scan data maintain a predetermined phase relationship.

2. A method of component testing according to claim 1 wherein said step of applying a periodic test stimulus waveform to the DUT includes digitally synthesizing the test stimulus waveform.

3. A method of component testing according to claim 2 wherein said triggering step includes triggering each of the voltage and current measuring steps at a common trigger point relative to respective cycles of the periodic test stimulus waveform.

4. A method of component testing according to claim 3 wherein each of the voltage and current measuring steps has a duration equal to one cycle of the periodic test stimulus waveform.

5. A method of component testing according to claim 1 further comprising storing the acquired voltage and current scan data in a circular buffer in digital form.

6. A method of component testing according to claim 5 and further comprising concurrently displaying the stored voltage scan data and current scan data in a graphical form so as to form a Lissajous-type of pattern.

7. A method of component testing according to claim 5 wherein the periodic test stimulus waveform has a predetermined peak voltage and said applying the periodic test stimulus waveform includes selecting a desired frequency of the stimulus waveform.

8. A method of component testing according to claim 7 wherein the peak voltage is on the order of 3.2 volts and the frequency is selected within a range of approximately 2 Hz to 20 kHz.

9. A method of component testing according to claim 7 wherein said displaying step includes selecting a desired frequency of the test stimulus waveform from among a predetermined set of available frequencies that extends over a range of approximately 2 Hz to 20 kHz so as to size the resulting graphical display as appropriate for visual inspection.

10. A method of component testing according to claim 7 wherein said displaying step includes providing a liquid crystal type of display panel for low-power operation, and driving the display panel responsive to the voltage and current scan data.

11. A method of component testing according to claim 7 wherein said selecting step includes providing a plurality of soft keys on the instrument, and selecting the frequency responsive to user input through the soft keys.

12. A test instrument comprising:

digital means for generating a periodic test stimulus waveform;

means for applying the test stimulus waveform to a DUT;

a single-channel input means for measuring predetermined parameters at the DUT;

data acquisition means coupled to the input means for acquiring measurement data and for converting the acquired measurement data into digital scan data;

means for storing the digital scan data;

trigger means coupled to the digital generating means for controlling said storing means so as to store a first series of scan data beginning at a predetermined trigger point relative to a first cycle of the periodic test stimulus waveform;

the trigger means including means for controlling said storing means so as to store a second series of scan data beginning at the predetermined trigger point relative to a second cycle of the periodic test stimulus waveform; whereby the second series of scan data is synchronized with the first series of scan data relative to the test stimulus waveform; and display means coupled to the storing means for displaying the first and second series of scan data together so as to form a Lissajous-type pattern.

13. A test instrument according to claim 12 wherein the digital means for generating a periodic test stimulus waveform includes means for selecting a desired frequency of the test stimulus waveform, thereby allowing testing of components over a range of reactance without changing the test stimulus waveform voltage.

14. A test instrument according to claim 13 wherein the frequency selecting means includes a plurality of soft keys, each soft key corresponding to a respective one of a predetermined set of available frequencies.

15. A test instrument according to claim 13 wherein the selecting means includes means for selecting the desired frequency from a set of available frequencies that extends over a range of approximately 2 Hz to 20 kHz.

16. A test instrument according to claim 13 wherein the means for generating a periodic test stimulus signal includes a digital synthesis circuit having a lookup table for providing a predetermined series of digital values for forming the test stimulus signal, and the selecting means includes a divide-by-n circuit for clocking the stimulus waveform generating means.

17. A test instrument according to claim 12 wherein the means for storing the digital scan data includes a memory and means for addressing the memory as a circular buffer.

18. A test instrument for component test comprising:

a digital waveform generator for providing a periodic test stimulus waveform to a DUT;

component test trigger means coupled to the waveform generator to provide a trigger signal at a predetermined time relative to each cycle of the test stimulus waveform; and data acquisition means coupled to receive the trigger signal for performing a voltage scan and for performing a current scan;

the data acquisition means including means for starting each of the voltage scan and the current scan in response to the trigger signal during a different respective cycle of the test stimulus waveform, so as to maintain a predetermined phase relationship between the voltage scan and the current scan.

19. A test instrument according to claim 18 wherein the waveform generator includes means for driving the test stimulus waveform at a predetermined peak voltage, and further includes means for generating the test stimulus waveform at a selected frequency within a range of approximately 2 Hz to 20 kHz, thereby allowing component testing over a wide range of reactance without changing the peak voltage of the stimulus waveform.

20. A test instrument according to claim 19 further comprising:

means for storing data acquired during the voltage scan and for storing data acquired during the current scan; and a pixel-addressable display means for displaying the stored voltage and current scan data so as to form a Lissajous-type of graphical display pattern.

* * * * *